United States Patent
Nakano et al.

(10) Patent No.: US 10,237,995 B2
(45) Date of Patent: Mar. 19, 2019

(54) ELECTRICAL CONNECTION BOX AND WIRE HARNESS

(71) Applicant: Yazaki Corporation, Tokyo (JP)

(72) Inventors: Ryo Nakano, Shizuoka (JP); Yukihiro Koyama, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/902,496

(22) Filed: Feb. 22, 2018

(65) Prior Publication Data

US 2018/0263128 A1 Sep. 13, 2018

(30) Foreign Application Priority Data

Mar. 9, 2017 (JP) ................. 2017-044956

(51) Int. Cl.
  *H05K 5/00* (2006.01)
  *H05K 5/02* (2006.01)
  *B60R 16/02* (2006.01)
  *B60R 16/023* (2006.01)
  *H02G 3/16* (2006.01)
  (Continued)

(52) U.S. Cl.
  CPC ....... *H05K 5/0221* (2013.01); *B60R 16/0207* (2013.01); *B60R 16/0238* (2013.01); *H02G 3/081* (2013.01); *H02G 3/16* (2013.01); *H01H 2085/208* (2013.01); *H05K 5/0247* (2013.01)

(58) Field of Classification Search
  None
  See application file for complete search history.

(56) References Cited

U.S. PATENT DOCUMENTS 5,577,768 A * 11/1996 Taguchi ............. B60R 21/2035
                                                  280/728.2
7,140,885 B2 * 11/2006 Kitamura ............. H05K 5/0039
                                                  439/76.1
(Continued)

FOREIGN PATENT DOCUMENTS

JP       5-49138 A      2/1993
JP     2011-125173 A    6/2011

OTHER PUBLICATIONS

Communication dated Jan. 22, 2019 from the Japanese Patent Office in counterpart Application No. 2017-044956.

*Primary Examiner* — Courtney L Smith
*Assistant Examiner* — Rashen E Morrison
(74) *Attorney, Agent, or Firm* — Sughrue Mion, PLLC

(57) ABSTRACT

An electrical connection box includes first insertion lock mechanisms and second insertion lock mechanisms. The first insertion lock mechanisms include respective first insertion locking pieces and respective first insertion receivers, and serve as rotation fulcrums of relative rotation of a lower cover and a frame in a state in which the respective first insertion locking pieces are inserted into the respective first insertion receivers and the respective first insertion locking pieces are not locked in the respective first insertion receivers. The second insertion lock mechanisms include second insertion locking pieces and second insertion receivers, guide the second insertion locking pieces with the second insertion receivers in a state in which the first insertion lock mechanisms serve as the rotation fulcrums, and determine the relative positions of the frame and the lower cover.

7 Claims, 8 Drawing Sheets

(51) Int. Cl.
*H02G 3/08* (2006.01)
*H01H 85/20* (2006.01)

(56) References Cited

U.S. PATENT DOCUMENTS

| | | | | |
|---|---|---|---|---|
| 7,413,463 B2* | 8/2008 | Matsuo | ............... | H05K 5/0039 |
| | | | | 439/377 |
| 7,813,134 B2* | 10/2010 | Katsuro | ............. | H05K 7/20454 |
| | | | | 165/104.33 |
| 8,408,945 B2* | 4/2013 | Schober | ............... | H05K 5/0039 |
| | | | | 439/660 |
| 9,093,776 B2* | 7/2015 | Yamanaka | ............ | H05K 5/0069 |
| 9,313,936 B2* | 4/2016 | Seok | ................... | H05K 5/0039 |
| 2004/0212974 A1* | 10/2004 | Ice | ...................... | G02B 6/4277 |
| | | | | 361/801 |
| 2009/0103267 A1* | 4/2009 | Wieland | ............ | H05K 7/20409 |
| | | | | 361/707 |
| 2011/0013370 A1* | 1/2011 | Oota | ...................... | H01L 23/42 |
| | | | | 361/752 |
| 2012/0190252 A1* | 7/2012 | Pavlinsky | ........... | H01M 10/425 |
| | | | | 439/775 |
| 2012/0250271 A1* | 10/2012 | Chen | .................... | H05K 5/0208 |
| | | | | 361/752 |
| 2013/0286606 A1* | 10/2013 | Watanabe | ............ | H05K 7/1417 |
| | | | | 361/752 |
| 2014/0334115 A1* | 11/2014 | Yang | .................... | H05K 7/1427 |
| | | | | 361/752 |
| 2014/0362533 A1* | 12/2014 | Shin | ..................... | H05K 7/2039 |
| | | | | 361/707 |
| 2015/0022976 A1* | 1/2015 | Ott | ....................... | H01L 23/057 |
| | | | | 361/736 |

* cited by examiner

ELECTRICAL CONNECTION BOX AND WIRE HARNESS

CROSS-REFERENCE TO RELATED APPLICATION(S)

The present application claims priority to and incorporates by reference the entire contents of Japanese Patent Application No. 2017-044956 filed in Japan on Mar. 9, 2017.

BACKGROUND OF THE INVENTION

1. Field of the Invention

The present invention relates to an electrical connection box and a wire harness.

2. Description of the Related Art

Conventionally, electrical connection boxes (also referred to as junction boxes, fuse boxes, relay boxes, and the like) are mounted on a vehicle and collectively accommodate, in an inner space, various electronic component modules including connection processing parts such as a wire harness, and electric components such as a fuse, a relay, and an electronic control unit (for example, Japanese Patent Application Laid-open No. 2011-125173).

A housing of the electrical connection box may include, for example, a housing main body formed into a cylindrical shape and a cover member closing an opening of the housing main body. In this case, the electrical connection box has the configuration in which the electronic components are accommodated in the housing main body through the opening, and then, the cover member is assembled to the opening of the housing main body to close the opening. However, the electrical connection box has further room in improvement in workability when the cover member is assembled to the opening of the housing main body.

SUMMARY OF THE INVENTION

The present invention has been made in view of the above-mentioned circumstances and an object thereof is to provide an electrical connection box and a wire harness that can improve workability when a cover member is assembled to a housing main body.

In order to solve the above mentioned problem and achieve the object, an electric connection box according to one aspect of the present invention includes a housing main body that includes a housing peripheral wall portion formed into a ring-like shape by a plurality of wall portions that are continuous about an axial line and a housing opening formed by opening at least one side of the housing peripheral wall portion in an axial line direction along the axial line, the housing main body accommodating therein an electronic component; a cover member that includes a cover peripheral wall portion formed into a ring-like shape by a plurality of wall portions that are continuous about the axial line and a closure portion closing one side of the cover peripheral wall portion in the axial line direction, the cover member closing the housing opening; a first insertion lock mechanism that includes at least two first insertion locking pieces that are provided on a first wall portion among the wall portions of the cover peripheral wall portion and first insertion receivers that are provided on a first wall portion among the wall portions of the housing peripheral wall portion so as to correspond to the first insertion locking pieces and cause the first insertion locking pieces to be inserted and locked thereto, the first insertion lock mechanism serving as a rotation fulcrum of relative rotation of the cover member and the housing main body in a state in which the first insertion locking pieces are inserted into the first insertion receivers and the first insertion locking pieces are not locked in the first insertion receivers; and a second insertion lock mechanism that includes a second insertion locking piece that is provided to a second wall portion that is a different wall portion from the first wall portion among the wall portions of the cover peripheral wall portion and a second insertion receiver that is provided on a second wall portion that is a different wall portion from the first wall portion among the wall portions of the housing peripheral wall portion so as to correspond to the second insertion locking piece and cause the second insertion locking piece to be locked thereto, and that causes the second insertion receiver to guide the second insertion locking piece in a state in which the first insertion lock mechanism serves as the rotation fulcrum, and determine relative positions of the housing main body and the cover member.

According to another aspect of the present invention, in the electric connection box, it is preferable that when the cover member is assembled to the housing main body, after parts of the first insertion locking pieces are inserted into the first insertion receivers, the cover member and the housing main body are relatively rotated about, as the rotation fulcrum, abutment portions between the first insertion locking pieces and the first insertion receivers, and the second insertion receiver guides the second insertion locking piece to determine the relative positions of the housing main body and the cover member.

According to still another aspect of the present invention, in the electric connection box, it is preferable that a hook lock mechanism that includes a locking claw that is provided on a third wall portion that is a different wall portion from the first and second wall portions among the wall portions of the cover peripheral wall portion and a claw receiver that is provided on a third wall portion that is a different wall portion from the first and second wall portions among the wall portions of the housing peripheral wall portion in a state of being exposed to an outside so as to correspond to the locking claw, and that causes the locking claw to be hooked and locked to the claw receiver after the second insertion locking piece is guided.

According to still another aspect of the present invention, in the electric connection box, it is preferable that the first insertion receivers and the second insertion receiver have cylindrical portions each formed into a cylindrical shape and locking projections provided at inner side of the cylindrical portions, and the first insertion locking pieces and the second insertion locking piece include groove portions that are locked to the locking projections when being inserted into the cylindrical portions.

A wire harness according to still another aspect of the present invention includes a conductive wiring material; and an electrical connection box that is electrically connected to the wiring material, wherein the electrical connection box includes: a housing main body that includes a housing peripheral wall portion formed into a ring-like shape by a plurality of wall portions that are continuous about an axial line and a housing opening formed by opening at least one side of the housing peripheral wall portion in an axial line direction along the axial line, the housing main body accommodating therein an electronic component; a cover member that includes a cover peripheral wall portion formed into a ring-like shape by a plurality of wall portions that are continuous about the axial line and a closure portion closing one side of the cover peripheral wall portion in the axial line direction, the cover member closing the housing opening; a first insertion lock mechanism that includes at least two first insertion locking pieces that are provided on a first wall portion among the wall portions of the cover peripheral wall portion and first insertion receivers that are provided on a first wall portion among the wall portions of the housing peripheral wall portion so as to correspond to the first insertion locking pieces and cause the first insertion locking pieces to be inserted and locked thereto, the first insertion lock mechanism serving as a rotation fulcrum of relative rotation of the cover member and the housing main body in a state in which the first insertion locking pieces are inserted into the first insertion receivers and the first insertion locking pieces are not locked in the first insertion receivers; and a second insertion lock mechanism that includes a second insertion locking piece that is provided on a second wall portion that is a different wall portion from the first wall portion among the wall portions of the cover peripheral wall portion and a second insertion receiver that is provided on a second wall portion that is a different wall portion from the first wall portion among the wall portions of the housing peripheral wall portion so as to correspond to the second insertion locking piece and cause the second insertion locking piece to be locked thereto, and that causes the second insertion receiver to guide the second insertion locking piece in a state in which the first insertion lock mechanism serves as the rotation fulcrum, and determine relative positions of the housing main body and the cover member.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

A mode (embodiment) for carrying out the present invention will be described in detail with reference to the drawings. Contents that are described in the following embodiment do not limit the present invention. Components in the following description include components that those skilled in the art can easily suppose and substantially the same components. Furthermore, configurations in the following description can be appropriately combined. Various omissions, replacements, or changes of the configurations can be made in a range without departing from the gist of the present invention.

Embodiment

An electrical connection box 1 and a wire harness WH in the embodiment will be described. In the following description, a first direction is referred to as a "height direction X", a second direction is referred to as a "first width direction Y", and a third direction is referred to as a "second width direction Z" where the first direction, the second direction, and the third direction intersect with one another. The height direction (axial line direction) X, the first width direction Y, and the second width direction Z are orthogonal to one another. Typically, the height direction X extends along the vertical direction and the first width direction Y and the second width direction Z extend along the horizontal direction at a manufacturing stage of a vehicle (not illustrated) or in a state in which the electrical connection box 1 is mounted on the vehicle and the vehicle is located on a horizontal plane. In the following description, the side at which an upper cover 33, which will be described later, is provided in the height direction X is referred to as an upper side and the side at which a lower cover 32, which will be described later, is provided in the height direction X is referred to as a lower side in some cases. The respective directions that are used in the following description indicate directions in a state in which the parts are assembled with one another and the electrical connection box 1 is mounted on the vehicle, unless otherwise specified.

Figure 1:
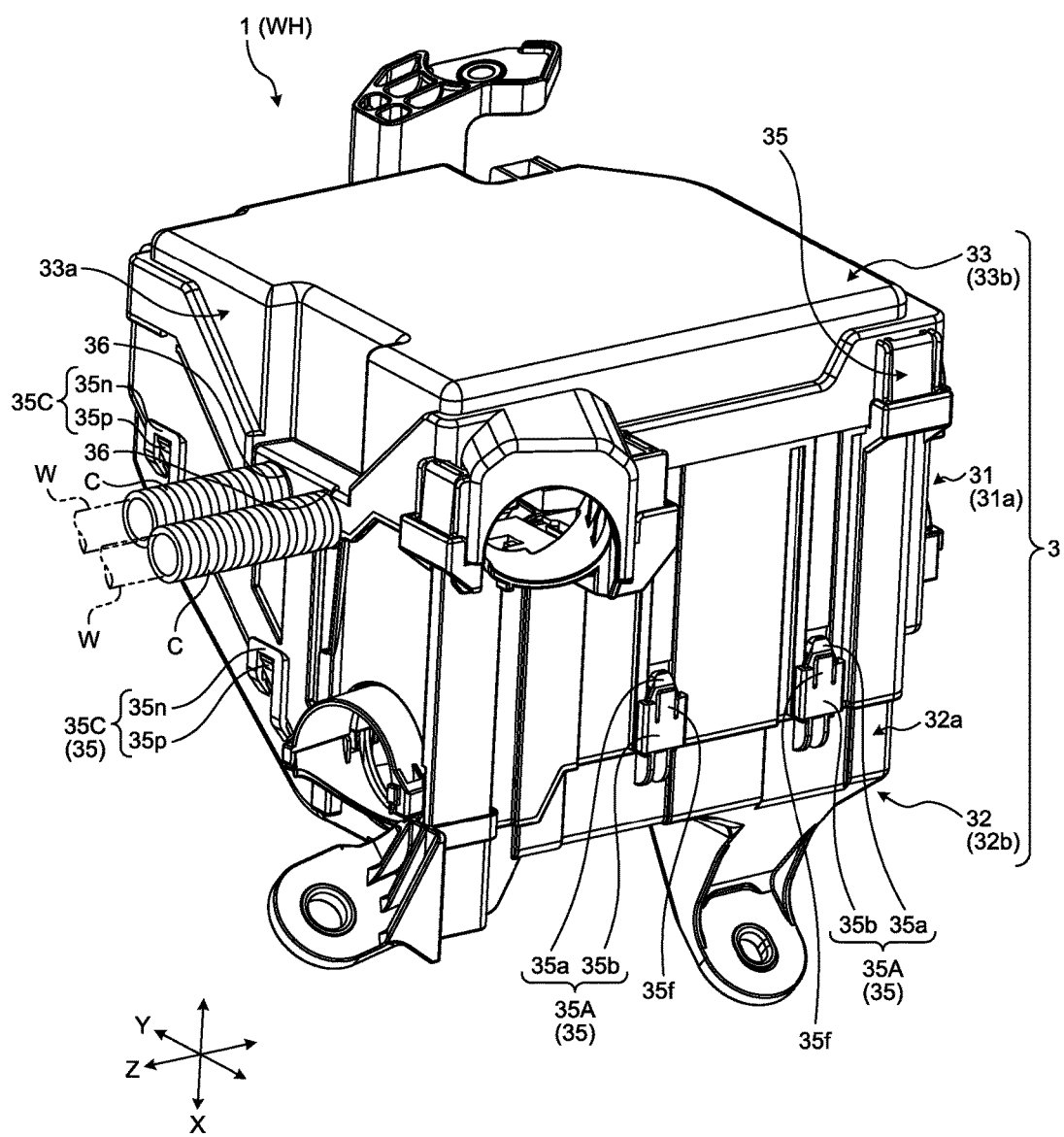
FIG. 1 is a perspective view illustrating a configuration example of an electrical connection box according to an embodiment.
Figure 2:
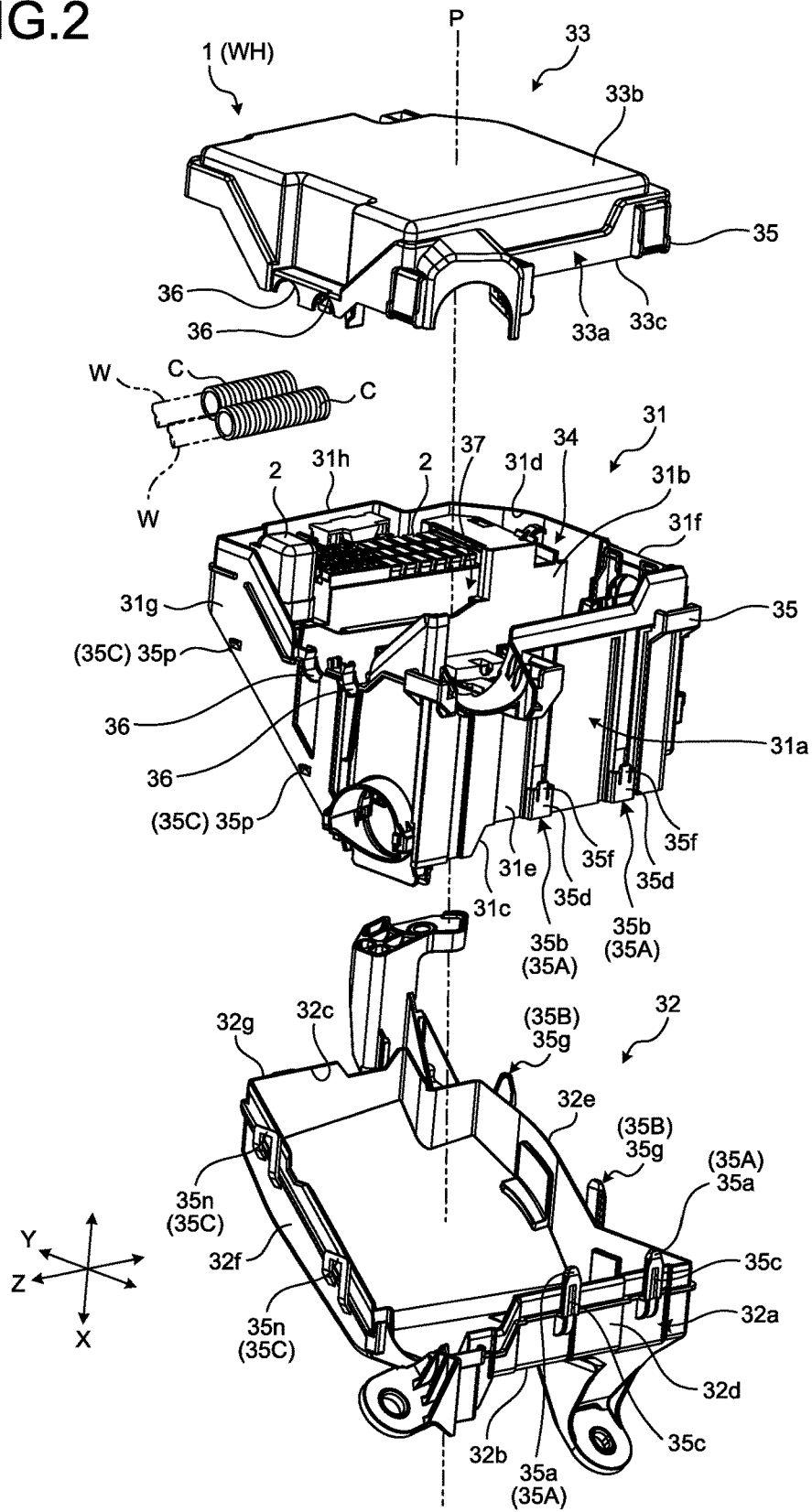
FIG. 2 is an exploded perspective view illustrating the configuration example of the electrical connection box in the embodiment.

The electrical connection box 1 in the embodiment, which is illustrated in FIG. 1 and FIG. 2, is mounted on the vehicle such as an automobile and is embedded into the wire harness WH. The wire harness WH is configured by forming collective components by bundling a plurality of wiring materials W to be used for power supply and signal communication, and connecting the wiring materials W to respective devices with connectors and the like in order to, for example, connect the devices that are mounted on the vehicle together. The wire harness WH includes the conductive wiring materials W, corrugate tubes C as covering materials in which the wiring materials W are inserted into, and the electrical connection box 1 that is electrically connected to the wiring materials W. The wiring materials W are formed by, for example, metal bars, electric wires, or electric wire bundles. The metal bars are formed by covering outer sides of conductive bar-like members with insulating covering portions. The electric wires are formed by covering outer sides of conductor portions (core wires) each made of a plurality of conductive metal strands with insulating covering portions. The electric wire bundles are formed by bundling the electric wires.

The corrugate tubes C are made of an insulating resin material and are each formed into a cylindrical shape (tubular shape), in this example, a columnar shape having flexibility. The corrugate tubes C have bellows shapes that ring-like irregularities are formed along the circumferential direction on the outer surfaces thereof and the irregularities are provided along the extension direction (axial direction). The wiring materials W are sheathed in the corrugate tubes C by inserting the wiring materials W into the corrugate tubes C so that the corrugate tubes C can cover and protect the outer circumferential sides of the wiring materials W. Furthermore, the corrugate tubes C may have slits for inserting the wiring materials W thereinto along the extension direction. The wire harness WH is configured by bundling and collecting the wiring materials W and electrically connecting the electrical connection box 1 thereto through terminals, connectors, and the like provided to the end of the bundled wiring materials W. The wire harness WH may further include a grommet, a protector, and a fixing tool in addition thereto.

The electrical connection box 1 collects and accommodates therein electric components such as the connector, a fuse, a relay, a capacitor, a branch portion, and an electronic control unit. The electrical connection box 1 is connected between a power source and various electronic apparatuses that are mounted in the vehicle with the wiring materials W and the like interposed therebetween. The electrical connection box 1 distributes electric power supplied from the power source to the electronic apparatuses in the vehicle. The electrical connection box 1 is also referred to as a junction box, a fuse box, a relay box, or the like in some cases but they are collectively referred to as the electrical connection box 1 in the embodiment.

The electrical connection box 1 includes a plurality of electronic components 2 and a housing 3. The electronic components 2 are accommodated in the housing 3 and the wiring materials W are electrically connected to the electronic components 2. Examples of the electronic components 2 include the connector, the fuse, the relay, the capacitor, the branch portion, the electronic control unit, and an electronic component unit formed by unitizing them.

The housing 3 accommodates the electronic components 2 in an accommodation space portion 34 as an internal space formed therein. The housing 3 includes a frame 31 as a housing main body, the lower cover 32 as a cover member, and the upper cover 33. The housing 3 is formed into a hollow box shape as a whole by assembling the frame 31, the lower cover 32, and the upper cover 33 with one another. The housing 3 has a three-layer divided structure in which the frame 31, the lower cover 32, and the upper cover 33 are separated from each other. The frame 31, the lower cover 32, and the upper cover 33 are made of insulating synthetic resin.

The frame 31 is a main member forming the accommodation space portion 34 and accommodates the electronic components 2 in the accommodation space portion 34. The frame 31 is formed into a hollow shape by a frame peripheral wall portion 31a serving as a housing peripheral wall portion formed into a ring-like shape by a plurality of wall portions that are continuous about an axial line P. That is to say, the frame 31 is formed into a cylindrical frame shape having frame openings 31c and 31d serving as housing openings in two surfaces opposing each other in the height direction X. The frame peripheral wall portion 31a is a wall body forming the accommodation space portion 34. The frame peripheral wall portion 31a is formed into a polygonal cylindrical shape (substantially rectangular cylindrical shape) and opens to both sides in the height direction X. The frame 31 has a plurality of partition plates 31b at the inner side of the frame peripheral wall portion 31a to subdivide the accommodation space portion 34 with the respective partition plates 31b. For example, the partition plate 31b is provided along the second width direction Z at the inner side of the frame peripheral wall portion 31a to partition the accommodation space portion 34 into substantially half.

The lower cover 32 is a dish-like (tray-like) member closing the lower opening of the frame 31 in the height direction X. The lower cover 32 is formed into a hollow shape by a lower cover peripheral wall portion 32a as a cover peripheral wall portion and a bottom surface portion 32b as a closure portion, and has an opening 32c. The lower cover peripheral wall portion 32a is a wall body formed into a ring-like shape by a plurality of wall portions that are continuous about the axial line P and forms a polygonal cylindrical shape (substantially rectangular cylindrical shape). The bottom surface portion 32b is a bottom body closing one opening (lower opening in the height direction X) of the lower cover peripheral wall portion 32a. The opening 32c is provided at the other side (upper side in the height direction X) of the lower cover peripheral wall portion 32a.

The upper cover 33 is a lid-like member closing the upper opening of the frame 31 in the height direction X. The upper cover 33 is formed into a hollow shape by an upper cover peripheral wall portion 33a and a ceiling surface 33b, and has an opening 33c. The upper cover peripheral wall portion 33a is a wall body formed into a ring-like shape by a plurality of wall portions that are continuous about the axial line P and forms a polygonal cylindrical shape (substantially rectangular cylindrical shape). The ceiling surface 33b is a ceiling body closing one opening (upper opening in the height direction X) of the upper cover peripheral wall portion 33a. The opening 33c is provided at the other side (lower side in the height direction X) of the upper cover peripheral wall portion 33a.

The housing 3 is located such that the frame opening 31c of the frame 31 at the lower side in the height direction X and the opening 32c of the lower cover 32 oppose each other and the frame opening 31d of the frame 31 at the upper side in the height direction X and the opening 33c of the upper cover 33 oppose each other. The housing 3 is configured by assembling the lower cover 32 at the lower side of the frame 31 in the height direction X to close, with the lower cover 32, the frame opening 31c of the frame 31 at the lower side in the height direction X.

Furthermore, the housing 3 is configured by assembling the upper cover 33 at the upper side of the frame 31 in the height direction X to close, with the upper cover 33, the frame opening 31d of the frame 31 at the upper side in the height direction X.

The housing 3 includes various systems of lock mechanism 35, which will be described later, and the upper cover 33 and the lower cover 32 are locked to the frame 31 through the various systems of lock mechanisms 35. The housing 3 is formed into a substantially rectangular parallelepiped shape as a whole while the direction along the first width direction Y corresponds to short sides and the direction along the second width direction Z corresponds to long sides. With this configuration, the housing 3 defines the accommodation space portion 34 in the frame 31, the lower cover 32, and the upper cover 33.

The accommodation space portion 34 is a space defined by the frame 31, the lower cover 32, and the upper cover 33 and surrounded by the frame 31, the lower cover 32, and the upper cover 33. The accommodation space portion 34 accommodates therein the electronic components 2. The frame peripheral wall portion 31a of the frame 31, the lower cover peripheral wall portion 32a of the lower cover 32, and the upper cover peripheral wall portion 33a of the upper cover 33 define the accommodation space portion 34 in the first width direction Y and the second width direction Z. The bottom surface portion 32b of the lower cover 32 defines the lower side of the accommodation space portion 34 in the height direction X and the ceiling surface 33b of the upper cover 33 defines the upper side thereof in the height direction X.

The electrical connection box 1 includes a block 37 in the accommodation space portion 34. The block 37 is assembled to the frame 31 in a detachable manner. The block 37 is made of insulating synthetic resin in the same manner as the frame 31 and the like. The block 37 may be divided into a plurality of parts. The block 37 has cavities formed as a large number of connection portions. The electronic components 2 are assembled in the respective cavities. A circuit body made of a conductive metal material is assembled to the block 37. The circuit body electrically connects together the electronic components 2 assembled in the respective cavities and configures a part of an electric circuit and is, for example, a busbar. The terminals and the like provided to the end of the wiring materials W wired through insertion ports 36 or the like of the housing 3 are inserted and fitted into the respective cavities of the block 37. The electronic components 2 are inserted and fitted into the respective cavities of the block 37 from the upper side thereof in the height direction X. With this configuration, the respective electronic components 2 and the wiring materials W are electrically connected to each other through the circuit body such as the busbar in a state of being assembled to and mounted on the block 37, and configure the required electric circuit.

The above-mentioned various systems of lock mechanisms 35 include, for example, first insertion lock mechanisms 35A, second insertion lock mechanisms 35B, and hook lock mechanisms 35C. The first insertion lock mechanisms 35A, the second insertion lock mechanisms 35B, and the hook lock mechanisms 35C are provided on different wall portions among a plurality of wall portions of the housing 3. The first insertion lock mechanisms 35A include first insertion locking pieces 35a and first insertion receivers 35b, and the first insertion locking pieces 35a are inserted into and locked in the first insertion receivers 35b. At least two first insertion locking pieces 35a are provided to the opening 32c side of a first wall portion 32d among the wall portions of the lower cover peripheral wall portion 32a. The first insertion locking pieces 35a are each formed into a long plate shape and extend along the height direction X, and front end portions of the respective first insertion locking pieces 35a protrude to the frame 31 side from the opening 32c of the lower cover 32. The first insertion locking pieces 35a include, on the front end portions thereof, groove portions 35c that are locked in the respective first insertion receivers 35b.

Figure 3:
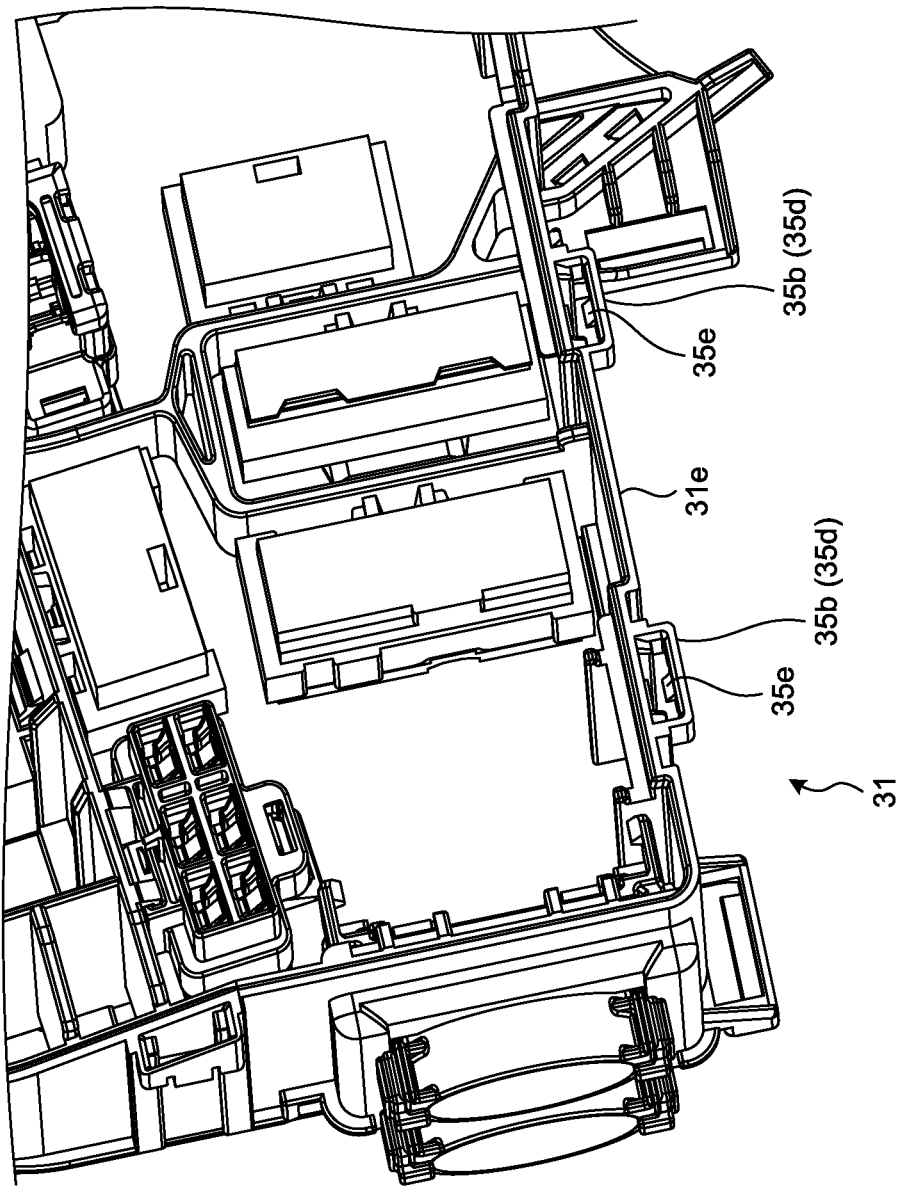
FIG. 3 is a perspective view illustrating a configuration example of first insertion receivers in the embodiment.

At least two first insertion receivers 35b are provided to the frame opening 31c side of a first wall portion 31e among the wall portions of the frame peripheral wall portion 31a so as to correspond to the first insertion locking pieces 35a. As illustrated in FIG. 3, the first insertion receivers 35b include cylindrical portions 35d and locking projections 35e. The cylindrical portions 35d are each formed into a cylindrical shape and extend along the height direction X. The first insertion locking pieces 35a are inserted into the cylindrical portions 35d. The cylindrical portions 35d each have two slits formed along the height direction X and include at least one elastic piece 35f formed between the slits. The locking projections 35e are provided at the inner sides of the cylindrical portions 35d and are each formed into a projection shape. The locking projections 35e each have a tapered shape at the side at which the first insertion locking pieces 35a are inserted. The locking projections 35e are provided to, for example, the elastic pieces 35f of the cylindrical portions 35d. With this provision manner, the locking projections 35e are once pressed up along the tapered shape by insertion of the first insertion locking pieces 35a, and then, are fitted into the groove portions 35c of the first insertion locking pieces 35a to be returned to respective original positions. The locking projections 35e are thereby locked in the groove portions 35c of the first insertion locking pieces 35a. The first insertion lock mechanisms 35A serve as rotation fulcrums of relative rotation of the lower cover 32 and the frame 31 in a state in which the respective first insertion locking pieces 35a are inserted into the respective first insertion receivers 35b and the respective first insertion locking pieces 35a are not locked in the respective first insertion receivers 35b. The first insertion lock mechanisms 35A are configured such that, for example, when the lower cover 32 is assembled to the frame 31, parts of the front end portions of the respective first insertion locking pieces 35a are inserted into the cylindrical portions 35d of the respective first insertion receivers 35b, and then, the lower cover 32 and the frame 31 are relatively rotated about, as the rotation fulcrums, abutment portions between the first insertion locking pieces 35a and the first insertion receivers 35b.

Figure 4:
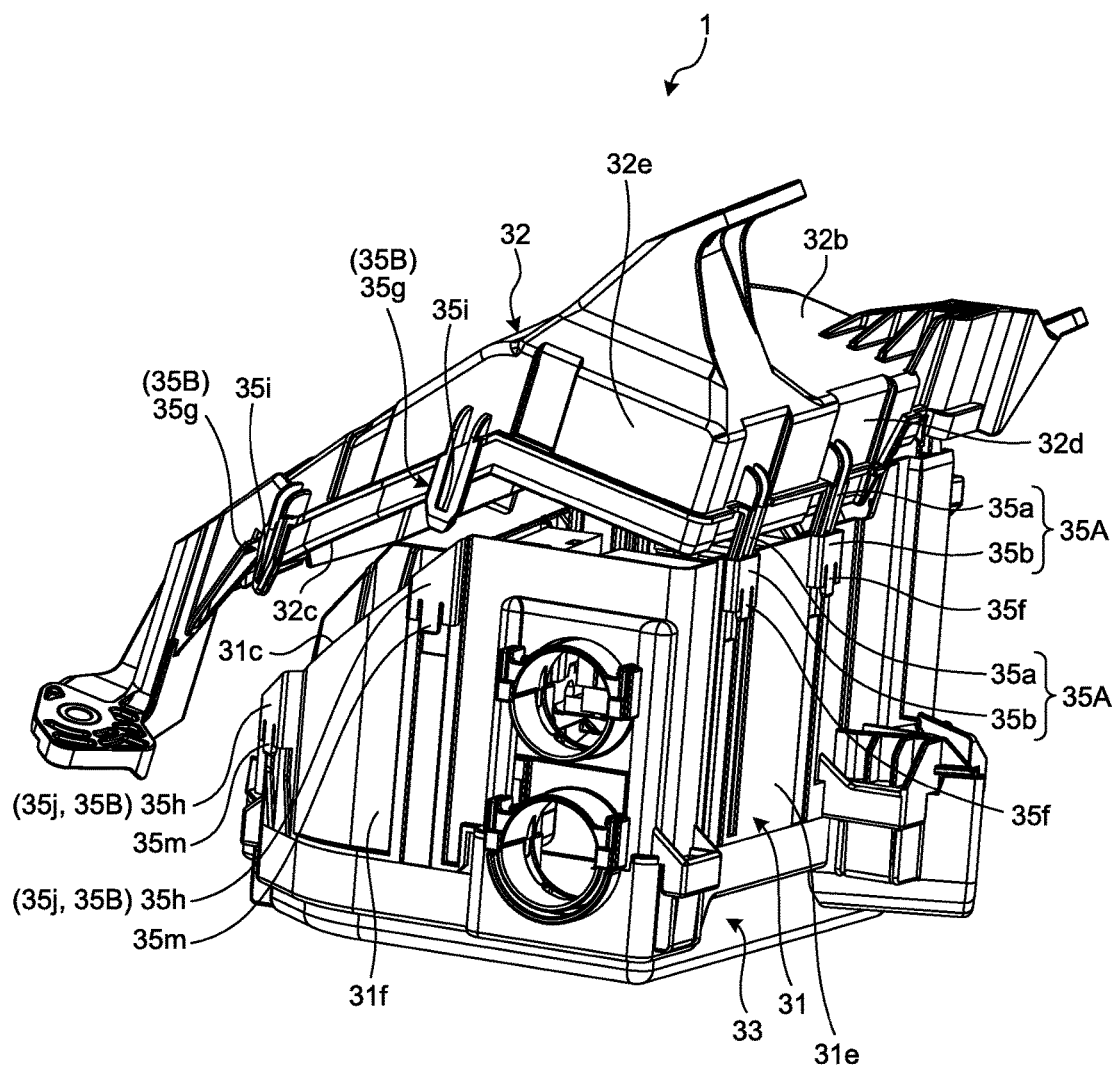
FIG. 4 is a perspective view illustrating a first assembly example of a lower cover in the embodiment.

As illustrated in FIG. 4, the second insertion lock mechanisms 35B have second insertion locking pieces 35g and second insertion receivers 35h, and the second insertion locking pieces 35g are guided with and locked to the second insertion receivers 35h. Two second insertion locking pieces 35g are provided at the opening 32c side on a second wall portion 32e that is a different wall portion from the first wall portion 32d among the wall portions of the lower cover peripheral wall portion 32a. The respective second insertion locking pieces 35g are formed in the same manner as the first insertion locking pieces 35a. That is to say, the second insertion locking pieces 35g are each formed into a long plate shape and extend along the height direction X, and front end portions of the respective second insertion locking pieces 35g protrude to the frame 31 side from the opening 32c of the lower cover 32. The second insertion locking pieces 35g have, on the front end portions, groove portions 35i that are locked in the respective second insertion receivers 35h.

Two second insertion receivers 35h are provided at the frame opening 31c side on a second wall portion 31f that is a different wall portion from the first wall portion 31e among the wall portions of the frame peripheral wall portion 31a so as to correspond to the second insertion locking pieces 35g. The second insertion receivers 35h are formed in the same manner as the above-mentioned first insertion receivers 35b. That is to say, the second insertion receivers 35h include cylindrical portions 35j and locking projections (not illustrated). The cylindrical portions 35j are each formed into a cylindrical shape and extend along the height direction X. The second insertion locking pieces 35g are inserted (guided) into the cylindrical portions 35j. The cylindrical portions 35j each have two slits formed along the height direction X and include at least one elastic piece 35m formed between the slits. The locking projections are provided to the inner side of the cylindrical portions 35j and are each formed into a projection shape. The locking projections each have a tapered shape at the side at which the second insertion locking pieces 35g are inserted. The locking projections are provided to, for example, the elastic pieces 35m of the cylindrical portions 35j. With this provision manner, the locking projections are once pressed up along the tapered shapes by insertion of the second insertion locking pieces 35g, and then, are fitted into the groove portions 35i of the second insertion locking pieces 35g to be returned to respective original positions. The locking projections are thereby locked in the groove portions 35i of the second insertion locking pieces 35g. The second insertion lock mechanisms 35B guide the respective second insertion locking pieces 35g with the respective second insertion receivers 35h and determine relative positions of the frame 31 and the lower cover 32 when the lower cover 32 and the frame 31 are relatively rotated in a state in which the first insertion lock mechanisms 35A serve as the rotation fulcrums.

Figure 6:
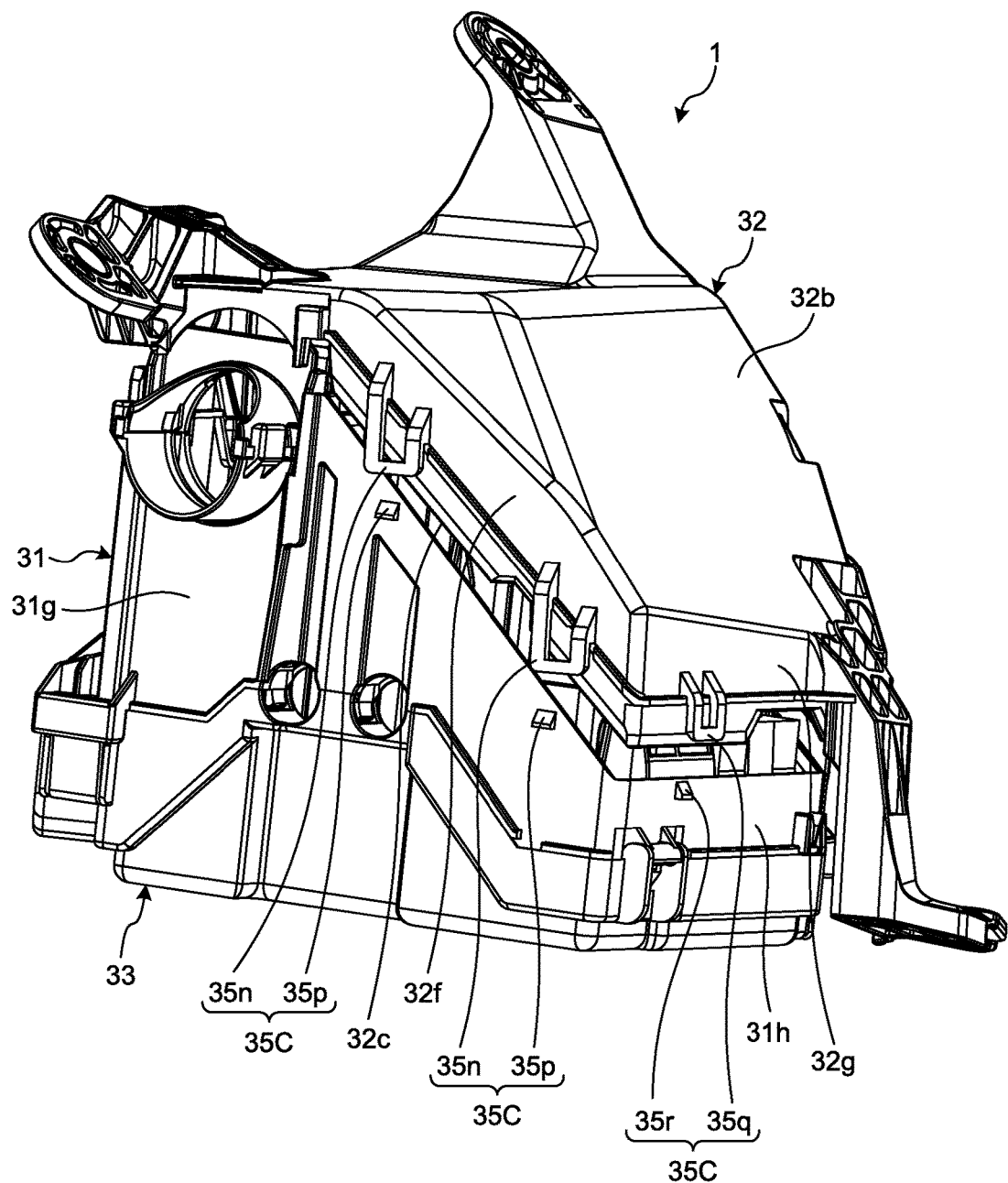
FIG. 6 is a perspective view illustrating the second assembly example of the lower cover in the embodiment.

The hook lock mechanisms 35C have locking claws 35n and claw receivers 35p, and the locking claws 35n are hooked and locked on the claw receivers 35p (see FIG. 6). Two locking claws 35n are provided at the opening 32c side on a third wall portion 32f that is a different wall portion from the first and second wall portions 32d and 32e among the wall portions of the lower cover peripheral wall portion 32a. The locking claws 35n are each formed into a U shape and parts of the respective locking claws 35n protrude to the frame 31 side from the opening 32c of the lower cover 32. The claw receivers 35p are projecting portions projecting from a third wall portion 31g that is a different wall portion from the first and second wall portions 31e and 31f among the wall portions of the frame peripheral wall portion 31a. Two claw receivers 35p are provided in a state of being exposed to the outside so as to correspond to the respective locking claws 35n.

The hook lock mechanism 35C further includes a locking claw 35q and a claw receiver 35r, and the locking claw 35q is hooked and locked on the claw receiver 35r. One locking claw 35q is provided at the opening 32c side on a fourth wall portion 32g that is a different wall portion from the first to third wall portions 32d, 32e, and 32f among the wall portions of the lower cover peripheral wall portion 32a. The locking claw 35q is formed into a U shape and a part of the locking claw 35q protrudes to the frame 31 side from the opening 32c of the lower cover 32. The claw receiver 35r is a projecting portion projecting from a fourth wall portion 31h that is a different wall portion from the first to third wall portions 31e, 31f, and 31g among the wall portions of the frame peripheral wall portion 31a. One claw receiver 35r is provided in a state of being exposed to the outside so as to correspond to the locking claw 35q. The hook lock mechanisms 35C guide the second insertion locking pieces 35g, and then, cause the locking claws 35n and 35q to be hooked and locked to the respective claw receivers 35p and 35r.

Figure 5:
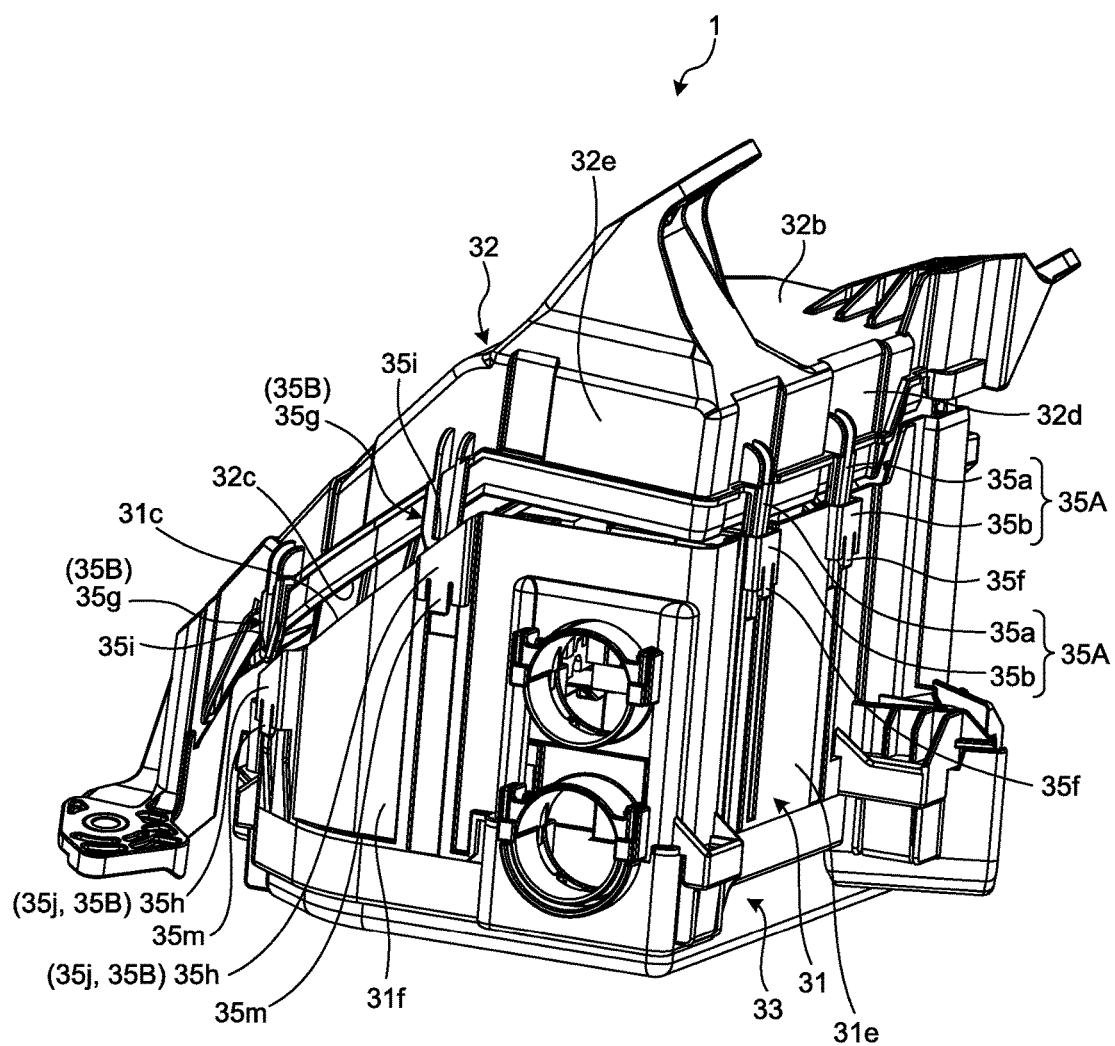
FIG. 5 is a perspective view illustrating a second assembly example of the lower cover in the embodiment.
Figure 7:
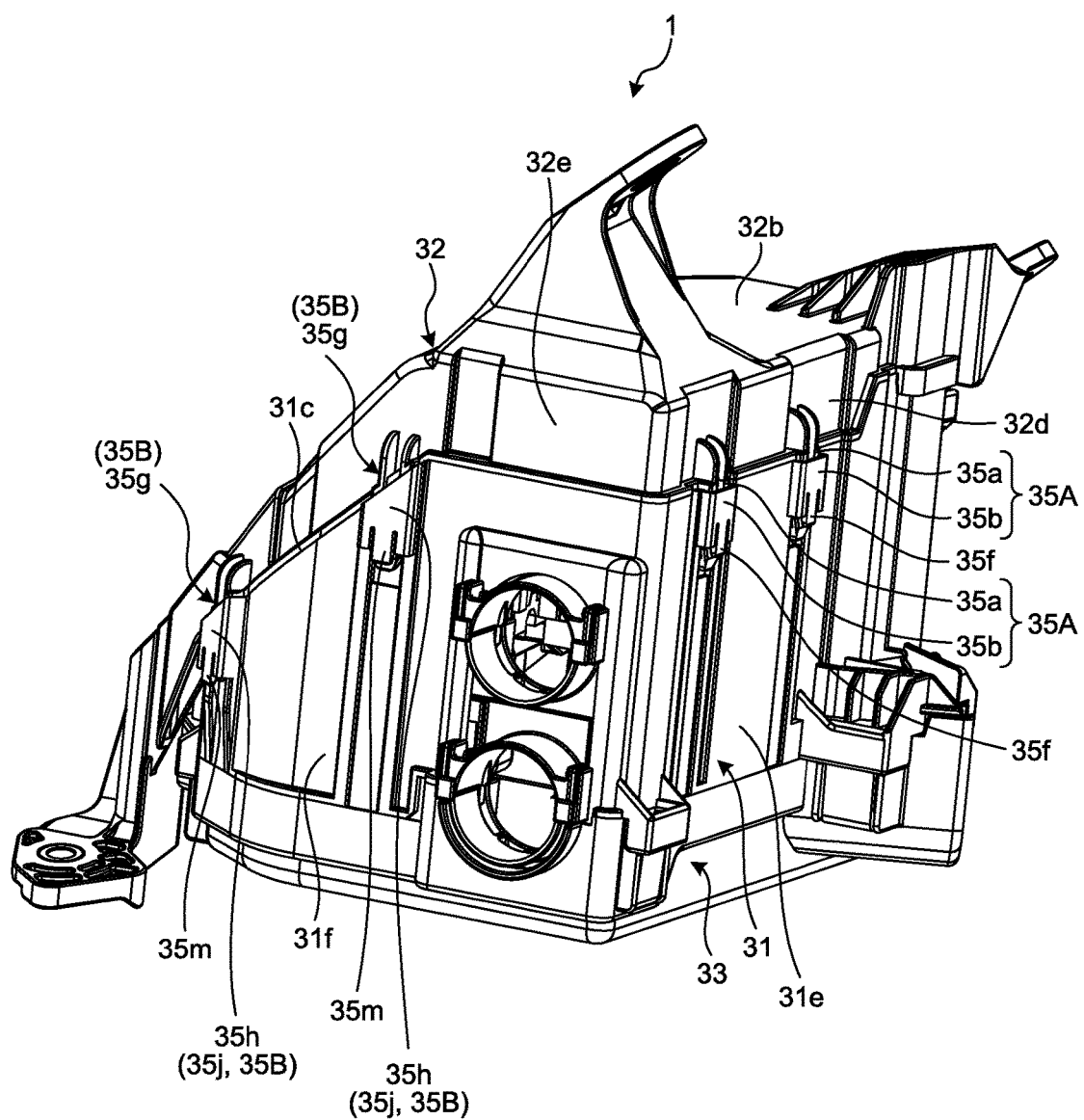
FIG. 7 is a perspective view illustrating a third assembly example of the lower cover in the embodiment.
Figure 8:
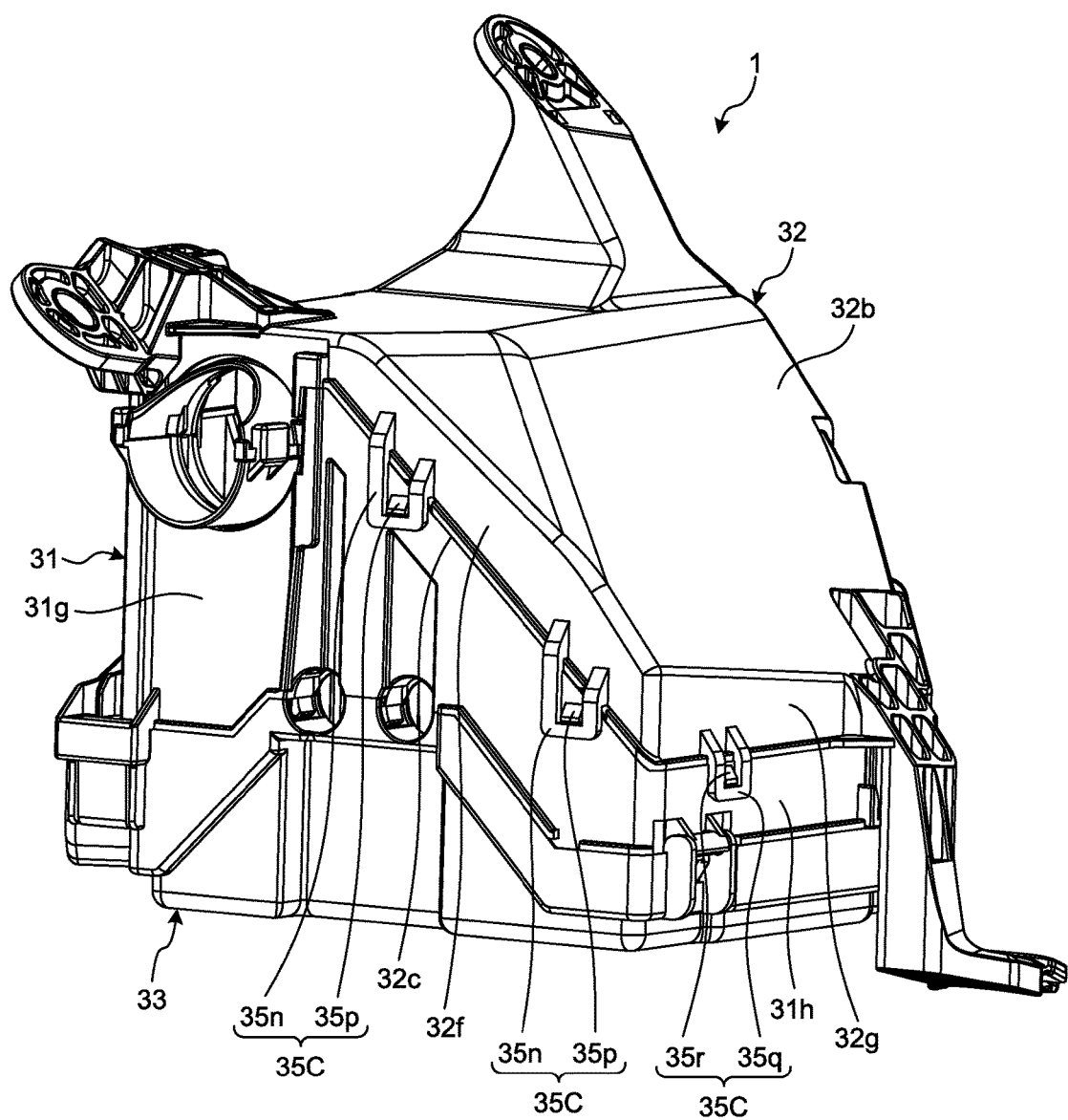
FIG. 8 is a perspective view illustrating the third assembly example of the lower cover in the embodiment.

Next, an example in which the lower cover 32 is assembled to the frame 31 will be described. As illustrated in FIG. 4, an operator inserts parts of the front end portions of the first insertion locking pieces 35a of the lower cover 32 into the cylindrical portions 35d of the respective first insertion receivers 35b of the frame 31 for the first insertion lock mechanisms 35A. Thereafter, as illustrated in FIG. 5, the operator relatively rotates the lower cover 32 and the frame 31 such that the respective front end portions of the first insertion locking pieces 35a and the respective cylindrical portions 35d of the first insertion receivers 35b are made close to each other with the abutment portions therebetween serving as the rotation fulcrums. In this case, in the electrical connection box 1, the respective second insertion receivers 35h of the second insertion lock mechanisms 35B guide the respective second insertion locking pieces 35g thereof to determine the relative positions of the frame 31 and the lower cover 32. In the electrical connection box 1, relative positions of the respective locking claws 35n and 35q and the respective claw receivers 35p and 35r of the hook lock mechanisms 35C can therefore be determined. At this time point, in the electrical connection box 1, the locking claws 35n and 35q of the hook lock mechanisms 35C are not hooked to the respective claw receivers 35p and 35r thereof, as illustrated in FIG. 6. Then, as illustrated in FIG. 7, the operator further relatively rotates the lower cover 32 and the frame 31 while the abutment portions between the front end portions of the respective first insertion locking pieces 35a and the cylindrical portions 35d of the respective first insertion receivers 35b serve as the rotation fulcrums. With the relative rotation, the lower cover 32 completely closes the frame opening 31c of the frame 31 and, as illustrated in FIG. 8, the locking claws 35n and 35q of the hook lock mechanisms 35C are hooked and locked on the respective claw receivers 35p and 35r thereof.

As described above, the electrical connection box 1 and the wire harness WH in the embodiment include the frame 31, the lower cover 32, the first insertion lock mechanisms 35A, and the second insertion lock mechanisms 35B. The frame 31 includes the frame peripheral wall portion 31a formed into the ring-like shape by the wall portions that are continuous about the axial line P and the frame opening 31c formed by opening at least one side of the frame peripheral wall portion 31a in the axial line direction along the axial line P, and accommodates therein the electronic components 2. The lower cover 32 includes the lower cover peripheral wall portion 32a formed into the ring-like shape by the wall portions that are continuous about the axial line P and the bottom surface portion 32b closing one side of the lower cover peripheral wall portion 32a in the axial line direction, and closes the frame opening 31c. The first insertion lock mechanisms 35A include the at least two first insertion locking pieces 35a that are provided to the first wall portion 32d among the wall portions of the lower cover peripheral wall portion 32a and the first insertion receivers 35b that are provided on the first wall portion 31e among the wall portions of the frame peripheral wall portion 31a so as to correspond to the respective first insertion locking pieces 35a and cause the respective first insertion locking pieces 35a to be inserted and locked thereto. The first insertion lock mechanisms 35A serve as the rotation fulcrums of the relative rotation of the lower cover 32 and the frame 31 in a state in which the respective first insertion locking pieces 35a are inserted into the respective first insertion receivers 35b and the respective first insertion locking pieces 35a are not locked in the respective first insertion receivers 35b. The second insertion lock mechanisms 35B have the second insertion locking pieces 35g that are provided on the second wall portion 32e that is the different wall portion from the first wall portion 32d among the wall portions of the lower cover peripheral wall portion 32a and the second insertion receivers 35h that are provided on the second wall portion 31f that is the different wall portion from the first wall portion 31e among the wall portions of the frame peripheral wall portion 31a so as to correspond to the second insertion locking pieces 35g and cause the second insertion locking pieces 35g to be locked thereto. The second insertion lock mechanisms 35B guide the second insertion locking pieces 35g with the second insertion receivers 35h in the state in which the first insertion lock mechanisms 35A serve as the rotation fulcrums and determine the relative positions of the frame 31 and the lower cover 32.

In this manner, in the electrical connection box 1 and the wire harness WH, when the lower cover 32 is assembled to the frame 31, the second insertion lock mechanisms 35B determine the relative positions of the frame 31 and the lower cover 32 while the first insertion lock mechanisms 35A serve as the rotation fulcrums. With this configuration, the electrical connection box 1 and the wire harness WH allow the first insertion lock mechanisms 35A and the second insertion lock mechanisms 35B to easily determine the relative positions of the frame 31 and the lower cover 32.

In addition, the electrical connection box 1 and the wire harness WH position the second insertion lock mechanisms 35B by rotating the lower cover 32 to the frame 31 side, thereby easily positioning the second insertion lock mechanisms 35B. Accordingly, the electrical connection box 1 and the wire harness WH can improve workability when the lower cover 32 is assembled to the frame 31 in comparison with the case in which a lower cover is assembled to a frame while all of lock mechanisms are simultaneously positioned as in the conventional technique.

In the electrical connection box 1, when the lower cover 32 is assembled to the frame 31, after the parts of the first insertion locking pieces 35a are inserted into the first insertion receivers 35b, the lower cover 32 and the frame 31 are relatively rotated about, as the rotation fulcrums, the abutment portions between the first insertion locking pieces 35a and the first insertion receivers 35b, and the second insertion receivers 35h guide the second insertion locking pieces 35g to determine the relative positions of the frame 31 and the lower cover 32.

Consequently, the electrical connection box 1 enables the relative positions of the frame 31 and the lower cover 32 to be determined by guiding the second insertion locking pieces 35g with the second insertion receivers 35h in the second insertion lock mechanisms 35B while rotating the lower cover 32 about the rotation fulcrums of the first insertion lock mechanisms 35A.

The electrical connection box 1 further includes the hook lock mechanisms 35C including the locking claws 35n and the claw receivers 35p. The locking claws 35n are provided on the third wall portion 32f that is the different wall portion from the first and second wall portions 32d and 32e among the wall portions of the lower cover peripheral wall portion 32a. The claw receivers 35p are provided on the third wall portion 31g that is the different wall portion from the first and second wall portions 31e and 31f among the wall portions of the frame peripheral wall portion 31a in a state of being exposed to the outside so as to correspond to the locking claws 35n, and the locking claws 35n are hooked and locked to the claw receivers 35p. The locking claws 35n of the hook lock mechanisms 35C are hooked and locked to the claw receivers 35p thereof after the second insertion locking pieces 35g are guided.

With this configuration, in the electrical connection box 1, the locking claws 35n of the hook lock mechanisms 35C are locked to the claw receivers 35p thereof after the relative positions of the frame 31 and the lower cover 32 are determined. Consequently, the locking claws 35n and the claw receivers 35p can eliminate the necessity of the function of serving as the rotation fulcrums and the guiding function as described above, thereby being specialized in the locking function. Accordingly, the electrical connection box 1 can have simplified configurations of the locking claws 35n and the claw receivers 35p of the hook lock mechanisms 35C, and this enables the locking claws 35n and the claw receivers 35p to be easily manufactured.

In the electrical connection box 1, the first insertion receivers 35b include the cylindrical portions 35d each formed into the cylindrical shape and the locking projections 35e provided at the inner side of the respective cylindrical portions 35d, and the first insertion locking pieces 35a include the groove portions 35c that are locked to the locking projections 35e when being inserted into the cylindrical portions 35d. The respective second insertion receivers 35h include the cylindrical portions 35j each formed into the cylindrical shape and the locking projections (not illustrated) provided at the inner side of the cylindrical portions 35j, and the second insertion locking pieces 35g include the groove portions 35i that are locked to the locking projections when being inserted into the cylindrical portions 35j.

With this configuration, the electrical connection box 1 enables the abutment portions between the first insertion locking pieces 35a and the first insertion receivers 35b to serve as the rotation fulcrums by inserting the parts of the front end portions of the respective insertion locking pieces 35a into the cylindrical portions 35d of the respective first insertion receiver 35b. Furthermore, the electrical connection box 1 enables the relative positions of the frame 31 and the lower cover 32 to be determined by inserting the parts of the front end portions of the second insertion locking pieces 35g into the cylindrical portions 35j of the second insertion receivers 35h and guiding the second insertion locking pieces 35g with the second insertion receivers 35h.

Modifications

Next, modifications of the embodiment will be described. Although the lock mechanisms 35 are applied when the lower cover 32 is assembled to the frame 31, as an example, they are not limited thereto. For example, the lock mechanisms 35 may be applied when the upper cover 33 is assembled to the frame 31.

The electrical connection box 1 may employ the first insertion lock mechanisms 35A including the first insertion locking pieces 35a and the first insertion receivers 35b instead of the hook lock mechanisms 35C.

Although the second insertion receivers 35h of the second insertion lock mechanisms 35B include the cylindrical portions 35j each formed into the cylindrical shape and the locking projections provided at the inner side of the cylindrical portions 35j, as an example, the second insertion receivers 35h are not limited thereto. The second insertion receivers 35h may include bar-like guide members (not illustrated) guiding the second insertion locking pieces 35g and locking projections (not illustrated) locking the second insertion locking pieces 35g in the vicinity of the guide members.

The electrical connection box and the wire harness according to the present embodiment include the first insertion lock mechanisms serving as the rotation fulcrums of the relative rotation of the cover member and the housing main body and the second insertion lock mechanisms determining the relative positions of the housing main body and the cover member. The electrical connection box and the wire harness can thereby improve workability when the cover member is assembled to the housing main body.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. An electrical connection box comprising:
a housing main body that includes a housing peripheral wall portion formed into a ring-like shape by a plurality of wall portions that are continuous about an axial line and a housing opening formed by opening at least one side of the housing peripheral wall portion in an axial line direction along the axial line, the housing main body accommodating therein an electronic component;
a cover member that includes a cover peripheral wall portion formed into a ring-like shape by a plurality of wall portions that are continuous about the axial line and a closure portion closing one side of the cover peripheral wall portion in the axial line direction, the cover member closing the housing opening;

a first insertion lock mechanism that includes at least two first insertion locking pieces that are provided on a first wall portion among the wall portions of the cover peripheral wall portion and first insertion receivers that are provided on a first wall portion among the wall portions of the housing peripheral wall portion so as to correspond to the first insertion locking pieces and cause the first insertion locking pieces to be inserted and locked thereto, the first insertion lock mechanism serving as a rotation fulcrum of relative rotation of the cover member and the housing main body in a state in which the first insertion locking pieces are inserted into the first insertion receivers and the first insertion locking pieces are not locked in the first insertion receivers; and a second insertion lock mechanism that includes a second insertion locking piece that is provided to a second wall portion that is a different wall portion from the first wall portion among the wall portions of the cover peripheral wall portion and a second insertion receiver that is provided on a second wall portion that is a different wall portion from the first wall portion among the wall portions of the housing peripheral wall portion so as to correspond to the second insertion locking piece and cause the second insertion locking piece to be locked thereto, and that causes the second insertion receiver to guide the second insertion locking piece in a state in which the first insertion lock mechanism serves as the rotation fulcrum, and determine relative positions of the housing main body and the cover member, when the cover member is assembled to the housing main body, after parts of the first insertion locking pieces are inserted into the first insertion receivers, the cover member and the housing main body are relatively rotated about, as the rotation fulcrum, abutment portions between the first insertion locking pieces and the first insertion receivers, and the second insertion receiver guides the second insertion locking piece to determine the relative positions of the housing main body and the cover member.

2. The electrical connection box according to claim 1, further comprising:

a hook lock mechanism that includes a locking claw that is provided on a third wall portion that is a different wall portion from the first and second wall portions among the wall portions of the cover peripheral wall portion and a claw receiver that is provided on a third wall portion that is a different wall portion from the first and second wall portions among the wall portions of the housing peripheral wall portion in a state of being exposed to an outside so as to correspond to the locking claw, and that causes the locking claw to be hooked and locked to the claw receiver after the second insertion locking piece is guided.

3. The electrical connection box according to claim 1, wherein the first insertion receivers and the second insertion receiver have cylindrical portions each formed into a cylindrical shape and locking projections provided at inner side of the cylindrical portions, and the first insertion locking pieces and the second insertion locking piece include groove portions that are locked to the locking projections when being inserted into the cylindrical portions.

4. The electrical connection box according to claim 2, wherein the first insertion receivers and the second insertion receiver have cylindrical portions each formed into a cylindrical shape and locking projections provided at inner side of the cylindrical portions, and the first insertion locking pieces and the second insertion locking piece include groove portions that are locked to the locking projections when being inserted into the cylindrical portions.

5. A wire harness comprising:

a conductive wiring material; and an electrical connection box that is electrically connected to the wiring material, wherein the electrical connection box includes:

a housing main body that includes a housing peripheral wall portion formed into a ring-like shape by a plurality of wall portions that are continuous about an axial line and a housing opening formed by opening at least one side of the housing peripheral wall portion in an axial line direction along the axial line, the housing main body accommodating therein an electronic component;

a cover member that includes a cover peripheral wall portion formed into a ring-like shape by a plurality of wall portions that are continuous about the axial line and a closure portion closing one side of the cover peripheral wall portion in the axial line direction, the cover member closing the housing opening;

a first insertion lock mechanism that includes at least two first insertion locking pieces that are provided on a first wall portion among the wall portions of the cover peripheral wall portion and first insertion receivers that are provided on a first wall portion among the wall portions of the housing peripheral wall portion so as to correspond to the first insertion locking pieces and cause the first insertion locking pieces to be inserted and locked thereto, the first insertion lock mechanism serving as a rotation fulcrum of relative rotation of the cover member and the housing main body in a state in which the first insertion locking pieces are inserted into the first insertion receivers and the first insertion locking pieces are not locked in the first insertion receivers; and a second insertion lock mechanism that includes a second insertion locking piece that is provided on a second wall portion that is a different wall portion from the first wall portion among the wall portions of the cover peripheral wall portion and a second insertion receiver that is provided on a second wall portion that is a different wall portion from the first wall portion among the wall portions of the housing peripheral wall portion so as to correspond to the second insertion locking piece and cause the second insertion locking piece to be locked thereto, and that causes the second insertion receiver to guide the second insertion locking piece in a state in which the first insertion lock mechanism serves as the rotation fulcrum, and determine relative positions of the housing main body and the cover member.

6. An electrical connection box comprising:

a housing main body that includes a housing peripheral wall portion formed into a ring-like shape by a plurality of wall portions that are continuous about an axial line and a housing opening formed by opening at least one side of the housing peripheral wall portion in an axial line direction along the axial line, the housing main body accommodating therein an electronic component;

a cover member that includes a cover peripheral wall portion formed into a ring-like shape by a plurality of wall portions that are continuous about the axial line and a closure portion closing one side of the cover peripheral wall portion in the axial line direction, the cover member closing the housing opening;

a first insertion lock mechanism that includes at least two first insertion locking pieces that are provided on a first wall portion among the wall portions of the cover peripheral wall portion and first insertion receivers that are provided on a first wall portion among the wall portions of the housing peripheral wall portion so as to correspond to the first insertion locking pieces and cause the first insertion locking pieces to be inserted and locked thereto, the first insertion lock mechanism serving as a rotation fulcrum of relative rotation of the cover member and the housing main body in a state in which the first insertion locking pieces are inserted into the first insertion receivers and the first insertion locking pieces are not locked in the first insertion receivers;

a second insertion lock mechanism that includes a second insertion locking piece that is provided to a second wall portion that is a different wall portion from the first wall portion among the wall portions of the cover peripheral wall portion and a second insertion receiver that is provided on a second wall portion that is a different wall portion from the first wall portion among the wall portions of the housing peripheral wall portion so as to correspond to the second insertion locking piece and cause the second insertion locking piece to be locked thereto, and that causes the second insertion receiver to guide the second insertion locking piece in a state in which the first insertion lock mechanism serves as the rotation fulcrum, and determine relative positions of the housing main body and the cover member; and a hook lock mechanism that includes a locking claw that is provided on a third wall portion that is a different wall portion from the first and second wall portions among the wall portions of the cover peripheral wall portion and a claw receiver that is provided on a third wall portion that is a different wall portion from the first and second wall portions among the wall portions of the housing peripheral wall portion in a state of being exposed to an outside so as to correspond to the locking claw, and that causes the locking claw to be hooked and locked to the claw receiver after the second insertion locking piece is guided.

7. The electrical connection box according to claim 6 wherein the first insertion receivers and the second insertion receiver have cylindrical portions each formed into a cylindrical shape and locking projections provided at inner side of the cylindrical portions, and the first insertion locking pieces and the second insertion locking piece include groove portions that are locked to the locking projections when being inserted into the cylindrical portions.

* * * * *